US011710768B2

(12) United States Patent
Miller et al.

(10) Patent No.: US 11,710,768 B2
(45) Date of Patent: Jul. 25, 2023

(54) HYBRID DIFFUSION BREAK WITH EUV GATE PATTERNING

(71) Applicant: INTERNATIONAL BUSINESS MACHINES CORPORATION, Armonk, NY (US)

(72) Inventors: Eric Miller, Watervliet, NY (US); Indira Seshadri, Niskayuna, NY (US); Andrew M. Greene, Slingerlands, NY (US); Julien Frougier, Albany, NY (US); Veeraraghavan S. Basker, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 17/303,275

(22) Filed: May 26, 2021

(65) Prior Publication Data

US 2022/0384568 A1    Dec. 1, 2022

(51) Int. Cl.
*H01L 29/06*  (2006.01)
*H01L 29/423*  (2006.01)
*H01L 29/786*  (2006.01)

(52) U.S. Cl.
CPC ...... *H01L 29/0642* (2013.01); *H01L 29/0665* (2013.01); *H01L 29/42392* (2013.01); *H01L 29/78696* (2013.01)

(58) Field of Classification Search
CPC ............ H01L 29/0642; H01L 29/0673; H01L 29/42392; H01L 29/0665; H01L 21/823431; H01L 21/823481
See application file for complete search history.

(56) References Cited

U.S. PATENT DOCUMENTS 8,609,510 B1    12/2013   Banna
9,406,676 B2     8/2016   Yu
(Continued)

FOREIGN PATENT DOCUMENTS

TW    201909425 A    3/2019
TW    201921454 A    6/2019
WO   2022248181 A1  12/2022

OTHER PUBLICATIONS

Notification of Transmittal of the International Search Report and the Written Opinion of the International Searching Authority, or the Declaration, dated Aug. 3, 2022, International application No. PCT/EP2022/062026, 13 pages.
(Continued)

*Primary Examiner* — Changhyun Yi
(74) *Attorney, Agent, or Firm* — Samuel A. Waldbaum

(57) ABSTRACT

An apparatus including a substrate and a first nanosheet device located on the substrate. A second nanosheet device is located on the substrate, where the second nanosheet device is adjacent to the first nanosheet device. At least one first gate located on the first nanosheet device and the at least one first gate has a first width. At least one second gate located on the second nanosheet device and the at least one second gate has a second width. The first width and the second width are substantially the same. A diffusion break located between the first nanosheet device and the second nanosheet device. The diffusion break prevents the first nanosheet device from contacting the second nanosheet device, and the diffusion break has a third width. The third width is larger than the first width and the second width.

20 Claims, 6 Drawing Sheets

(56) References Cited

U.S. PATENT DOCUMENTS

| | | |
|---|---|---|
| 9,634,138 B1 | 4/2017 | Choi |
| 9,947,804 B1 | 4/2018 | Frougier |
| 10,014,296 B1 | 7/2018 | Dou |
| 10,388,519 B2 | 8/2019 | Smith |
| 10,665,669 B1 | 5/2020 | Xie |
| 10,734,224 B2 | 8/2020 | Smith |
| 2019/0057867 A1 | 2/2019 | Smith |
| 2019/0058036 A1 | 2/2019 | Smith |
| 2020/0075574 A1 | 3/2020 | Smith |
| 2020/0328121 A1 | 10/2020 | Yao |
| 2020/0343144 A1 | 10/2020 | Li |
| 2020/0381307 A1 | 12/2020 | Xie |
| 2020/0381426 A1 | 12/2020 | Xu |
| 2022/0302172 A1* | 9/2022 | Hong ................... H01L 27/1203 |
| 2022/0336473 A1* | 10/2022 | Hong .............. H01L 21/823481 |

OTHER PUBLICATIONS

TW Office Action, Application No. 111109995, dated Nov. 11, 2022, Machine Translated, 19 pages.

\* cited by examiner

(12) United States Patent

HYBRID DIFFUSION BREAK WITH EUV GATE PATTERNING

BACKGROUND

The present invention relates generally to the field of nanosheets, and more particularly to concurrently forming a diffusion break between devices formed on the nanosheets.

When multiple devices are formed on a single substrate, the devices need to be isolated from each other to prevent errors. Diffusion breaks isolate adjacent devices from each other, however, when on the scale of nanosheets forming a diffusion breaks can cause defects to be formed.

BRIEF SUMMARY

Additional aspects and/or advantages will be set forth in part in the description which follows and, in part, will be apparent from the description, or may be learned by practice of the invention.

An apparatus comprising a substrate, a first nanosheet device located on the substrate, and a second nanosheet device located on the substrate, wherein the second nanosheet device is adjacent to the first nanosheet device. At least one first gate located on the first nanosheet device, wherein the at least one first gate has a first width. At least one second gate located on the second nanosheet device, wherein the at least one second gate has a second width, wherein the first width and the second width are substantially the same. A diffusion break located between the first nanosheet device and the second nanosheet device, wherein the diffusion break prevents the first nanosheet device from contacting the second nanosheet device, wherein the diffusion break has a third width, wherein the third width is larger than the first width and the second width.

An apparatus comprising a substrate, a first nanosheet device located on the substrate, a second nanosheet device located on the substrate, wherein the second nanosheet device is adjacent to the first nanosheet device, and a third nanosheet device located on the substrate, wherein the third nanosheet device is adjacent to the second nanosheet device. At least one first gate located on the first nanosheet device, wherein the at least one first gate has a first width. At least one second gate located on the second nanosheet device, wherein the at least one second gate has a second width, wherein the first width and the second width are substantially the same. At least one third gate located on the third nanosheet device, wherein the at least one third gate has a third width, wherein the third width and the second width are substantially the same. A first diffusion break located between the first nanosheet device and the second nanosheet device, wherein the first diffusion break prevents the first nanosheet device from contacting the second nanosheet device, wherein the first diffusion break has a fourth width, wherein the fourth width is larger than the first width and the second width. A second diffusion break located between the second nanosheet device and the third nanosheet device, wherein the second diffusion break prevents the second nanosheet device from contacting the third nanosheet device, wherein the second diffusion break has a fifth width, wherein the fifth width is larger than the second width and the third width.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1B:
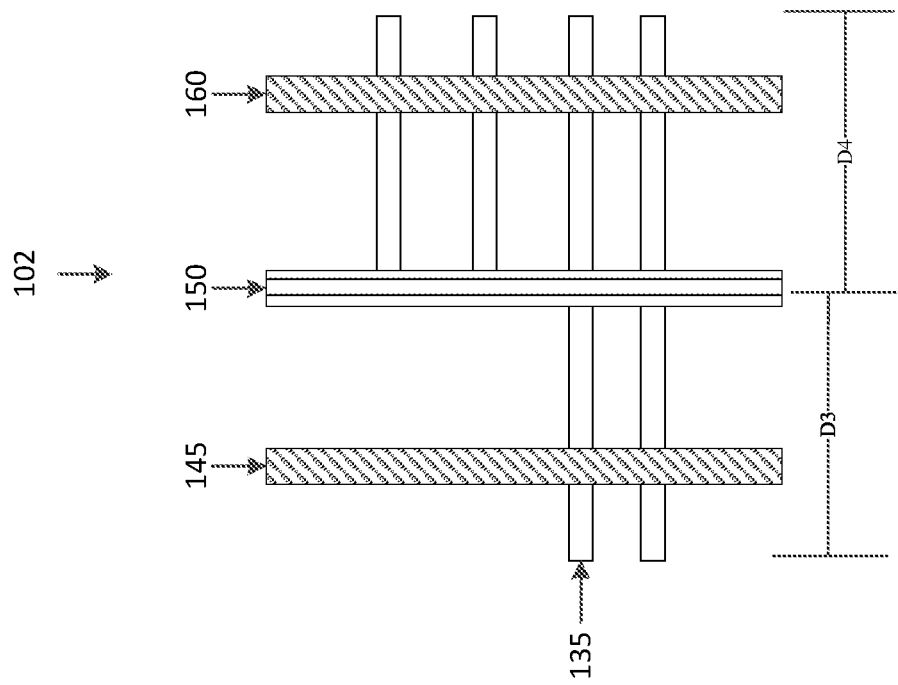
FIG. 1B illustrates a top-down view of a FinFET device, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art of affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various process used to form a micro-chip for an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (ME), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, wherein like reference numerals refer to like elements throughout. Multiple devices can be formed utilizing the same nanosheet(s) or a group of fins in a FinFET device. To separate the devices from each other a single diffusion break needs to be formed between adjacent devices. However, to form a single diffusion break in a fin that spans across the nanosheet(s) or fins at the location to separate the devices is not an easy process. A plurality of gates have the same dimensions are formed across the devices. A single diffusion break is formed by replacing one of the formed gates with a dummy gate. The problem of forming the dummy gate is targeting the formed gate to be replaced with the dummy gate. One solution is to form the dummy gate can be replaced with a self-aligned process, e.g., when removing the gate a wider opening is formed at the top of the gate for the formation of the dummy gate. This process allows for easier targeting of the gate for processing, thus allowing the gate to be replaced with a dummy gate. However, this process creates downstream processing defects since the wider top dummy gate extends past the sides of the spacer material creating an overhanging ledge. This ledge creates a blockage for depositing or removing materials between the gates. A way to create the dummy gate to prevent blockage and to save space on the substrate (i.e., the devices do not need to be separate by larger distances) includes manufacturing a gate (to be replaced with the dummy gate) located between adjacent devices wider than the neighboring gates. The wider gate allows for the gate to be targeted for replacement with the dummy gate.

Figure 1A:
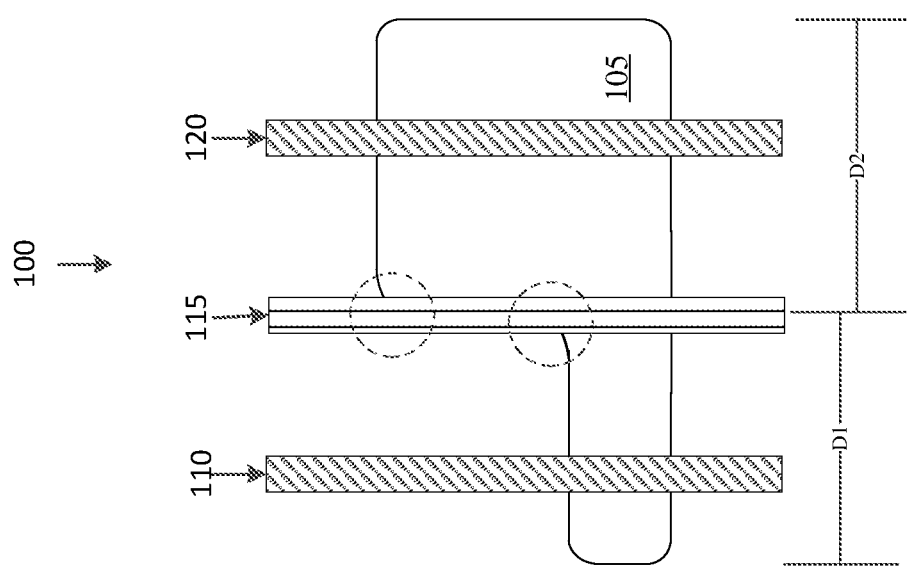
FIG. 1A illustrates a top-down view of nanosheet device, in accordance with an embodiment of the present invention.

FIG. 1A illustrates a top-down view of nanosheet device 100, in accordance with an embodiment of the present invention. The nanosheet device 100 includes a nanosheet 105, a first gate 110, a second gate 120, a dummy gate 115, a first device D1, and a second device D2. The dashed circles emphasize the rounding of the edges of the nanosheet 105 that occurs during the manufacturing process. The dummy gate 115 that acts as a single diffusion break between the first device D1 and the second device D2. However, since the edges of the nanosheet 105 are rounded, then the dummy gate 115 might not be a perfect single diffusion break.

Figure 2:
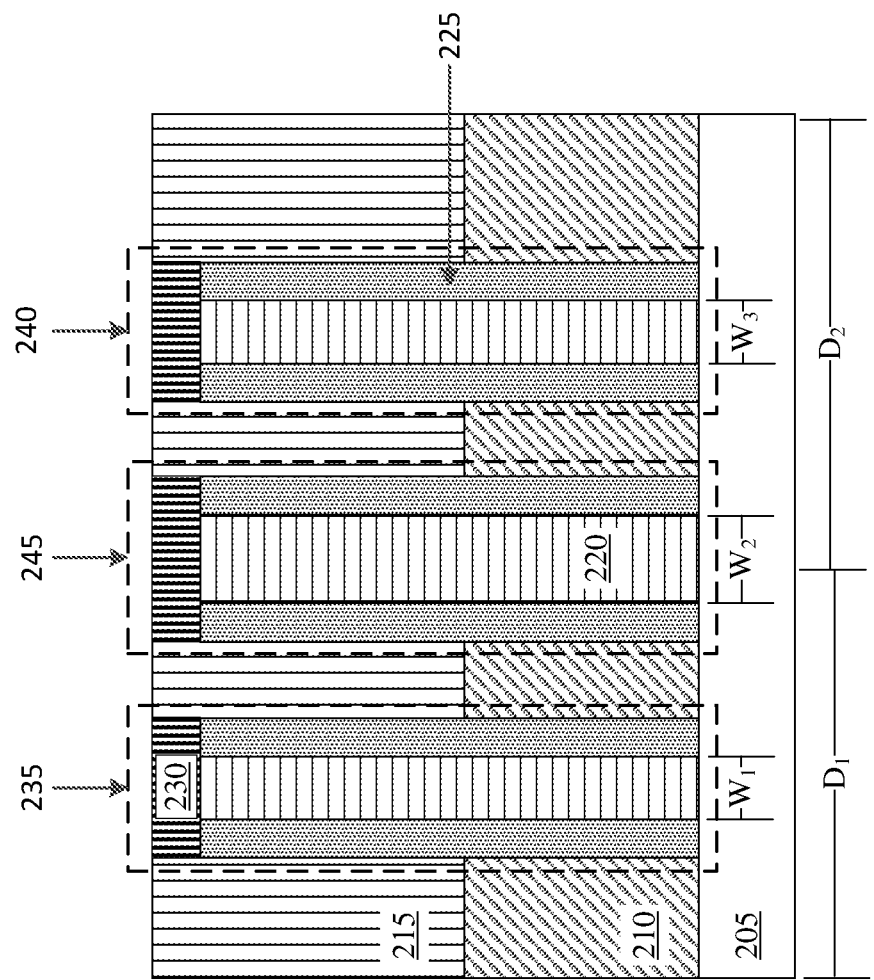
FIG. 2 illustrates a cross section view of showing the formation of three gates of a device, in accordance with an embodiment of the present invention.

FIG. 1B illustrates a top-down view of a FinFET device 102, in accordance with the embodiment of the present invention. The FinFET device 102 includes a plurality of fins 135, a first gate 145, a second gate 160, a dummy gate 150, a first device D3, and a second device D4. The dummy gate 150 acts as a single diffusion break between the first device D3 and the second device D4. FIG. 1B further illustrates that the FinFET device 102 does not suffer from the corner rounding problem since the FinFET device 102 is not direct print FIG. 2 illustrates a cross section of a nanosheet device 100 for the formation of a single diffusion break, in accordance with an embodiment of the present invention. The device includes a substrate 205, a source epi 210, a dielectric layer 215, a first gate 235, a second gate 245, and a third gate 240. The substrate 205 can be selected from a group consisting of a silicon wafer, a sapphire wafer, an insulator, a metal layer, or any other type of suitable layer. The nanosheet device 100 can include a source epi 210. The dielectric layer 215 is an ILD dielectric that is includes of any suitable dielectric material. FIG. 2 illustrates that the first device $D_1$ includes the first gate 235 and the second device $D_2$ utilizes the third gate 240. The two devices shown is meant for illustrative purposes only. Each the first gate 235, the second gate 245, and the third gate 240 includes a spacer 225, a gate metal 220, and a cap 230. The cap 230 can be comprised of SiN or other suitable material. The first gate 235 is formed with a width $W_1$, the second gate 245 has a width $W_2$, and the third gate 240 has a width $W_3$. The width $W_1$ of the first gate 235 is substantially equal to the width $W_3$ of the third gate 240. However, the width $W_2$ of the second gate is larger than the width $W_1$ and $W_3$ of the first gate 235 and the third gate 240. Having the width $W_2$ of the second gate 245 being larger than the widths of the other gates allows for the easier replacement of the second gate 245 with a dummy gate to create a single diffusion break between the first device D1 and the second device D2.

Figure 3:
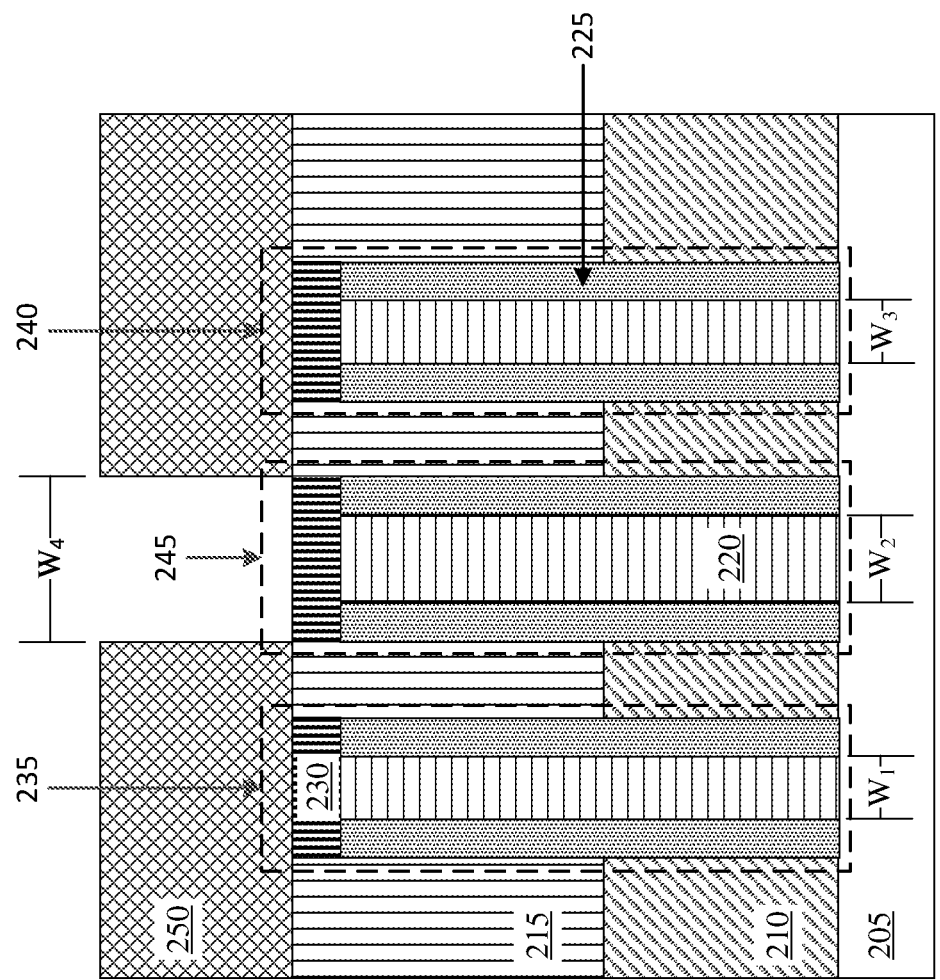
FIG. 3 illustrates a cross section view of isolating the active gates while the wider gate is exposed, in accordance with an embodiment of the present invention.

FIG. 3 illustrates a cross section of a device after formation and patterning of an OPL layer 250, in accordance with an embodiment of the present invention. The OPL layer 250 is formed on top of the dielectric layer 215 and the cap 230 of each of the gates 235, 245, and 240. The OPL layer 250 is patterned to expose the cap 230 of the second gate 245. The width W4 of the opening in the OPL layer 250 is large enough to expose the width $W_2$ of the second gate 245. The width $W_4$ as illustrated in FIG. 3 is as wider than the width $W_2$ of the gate metal 220 of the second gate 245. It is critical that width $W_4$ be equal to or larger than width $W_2$ in order to perform the subsequent fabrication processes discussed below. Since the width $W_2$ of the second gate 245 is larger than the widths of the other gates, for example, W2 is 2 to 20 nm larger than the widths of the other gates, it is easier to align the hole in the OPL layer 250 with the second gate 245. The OPL layer 250 is comprised of an optical planarization material but any type of lithography material.

Figure 4:
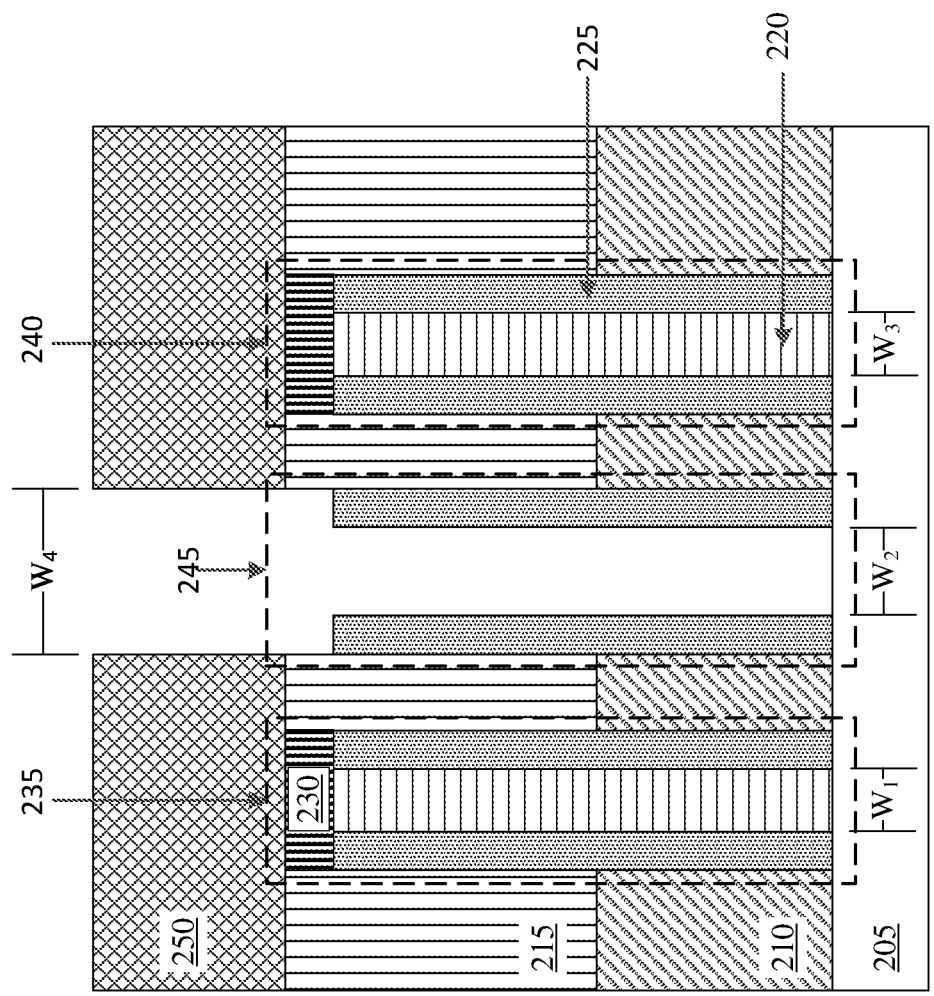
FIG. 4 illustrates a cross section view of the removal of the gate material from the exposed gate, in accordance with an embodiment of the present invention.

FIG. 4 illustrates a cross section of a device after removal of the of the cap 230 and the gate metal 220 located in the second gate 245, in accordance with an embodiment of the present invention. The cap 230 and the gate metal 220 of the second gate 245 are removed. The width $W_2$ of the second gate 245 is wide enough to allow complete the removal of the material, for example, the width $W_2$ can be in the range of 10-50 nm, more preferably in the range of 18-38 nm. The width $W_2$ is 2-20 nm wider than the widths $W_1$ or $W_3$, more preferably, $W_2$ is 2-10 nm wider than the widths $W_1$ or $W_3$. If the width $W_2$ of the second gate is too larger than the space saving effects of forming the single diffusion break is lost. FIG. 4 illustrates that the cap 230 and the gate metal 220 of the second gate 245 is removed selective to the spacer 225 of the second gate 245.

Figure 5:
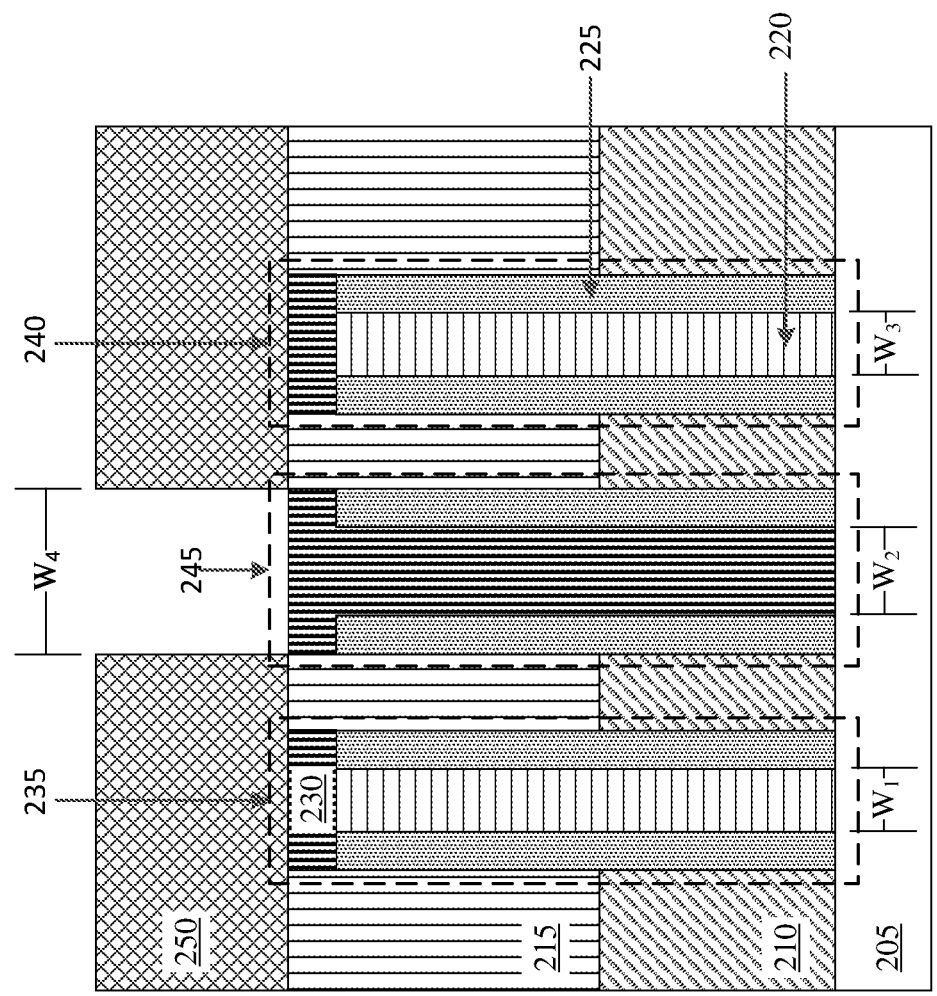
FIG. 5 illustrates a cross section view of a device for the formation of a diffusion break, in accordance with an embodiment of the present invention.

FIG. 5 illustrates a cross section of a device after the formation of the single diffusion break, in accordance with an embodiment of the present invention. The diffusion break is created by filling the second gate 245 with a filler material that can act as a dummy gate/diffusion break, such as, SiN or other suitable material. The second gate 245, or the diffusion break allows for the first device $D_1$ and second device $D_2$ to be electrically separated, and by having the width $W_2$ being larger than widths $W_1$ and $W_3$ allows for the easier formation of the diffusion break. The cap 230 forms the top of the second gate 245 (e.g. the dummy gate/diffusion break) and the cap 230 material extends down the gate to the substrate 205. Furthermore, by having a wider second gate 245, e.g., the dummy gate/diffusion break, the width of the gate is large enough to extend over the round edges of the nanosheet(s). FIG. 5 illustrates an active gate (first gate 235) for the first device and an active gate (the third gate 240) for the second device. A single diffusion break (the dummy gate, i.e., the second gate 245) separates the first device and the second device.

Figure 6:
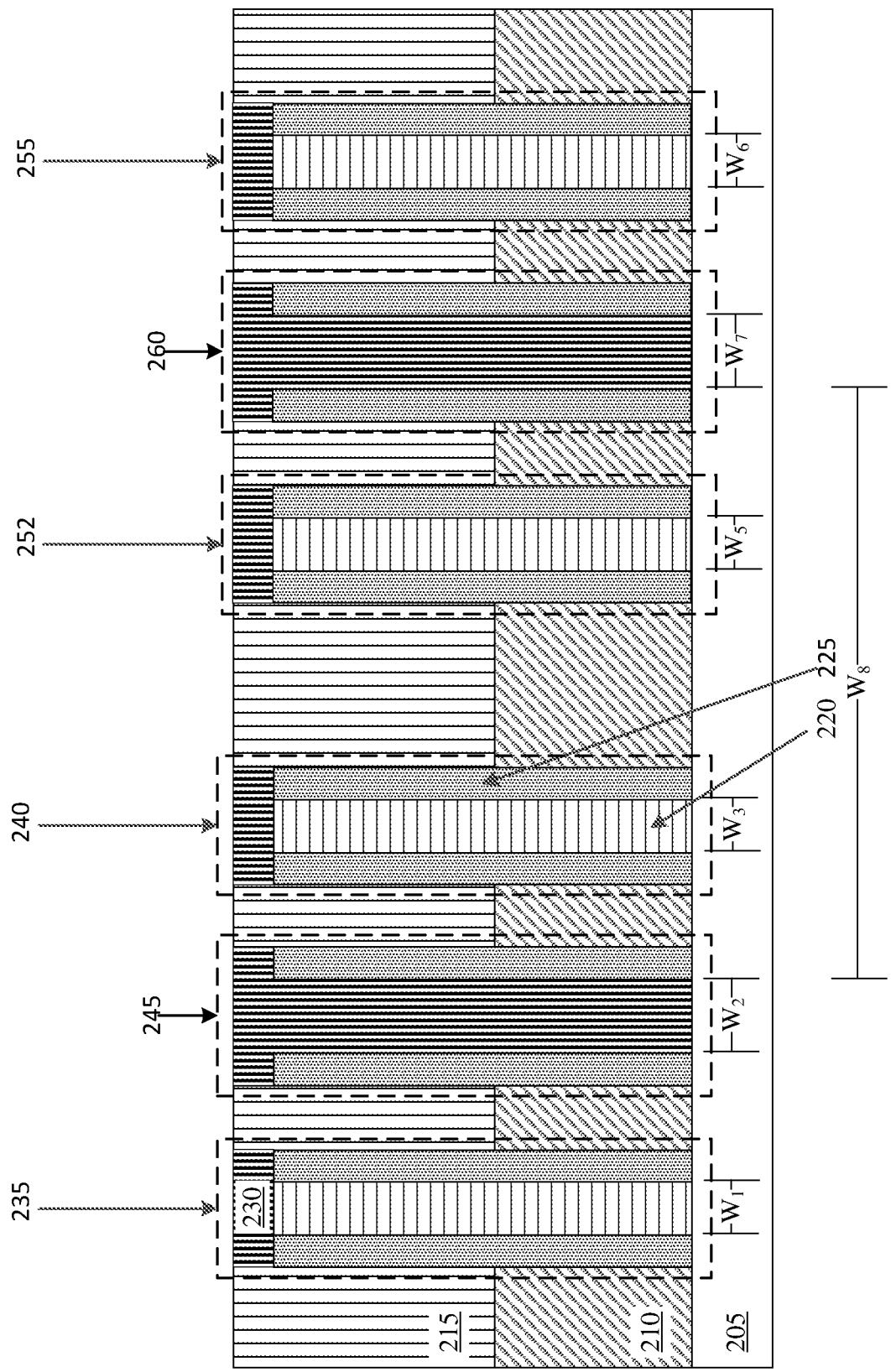
FIG. 6 illustrates a cross section view of a device having multiple diffusion breaks, in accordance with an embodiment of the present invention.

FIG. 6 illustrates a cross section of a device having multiple diffusion breaks, in accordance with an embodiment of the present invention. A plurality of devices can be formed on the same substrate 205, for example, more than three devices can be formed on the same substrate using the same nanosheet stack or fins as a foundation for the devices, wherein each of the devices needs to be electrically separated from each other. The plurality of devices includes a source epi 210, a dielectric layer 215, a first gate 235, a second gate 245, a third gate 240, a fourth gate 252, a fifth gate 260, and a sixth gate 255. For example, the second gate 245 and the fifth gate 260 can be dummy gates or a diffusion break between devices. By having multiple dummy gates/diffusion breaks allows for multiple devices to be formed on the same substrate 205. Each dummy gate/diffusion break can have a width in the range of 10-50 nm, more preferably in the range of 18-38 nm. The width of the dummy gates is 2-20 nm wider than the widths of the other gates (non-dummy gate), more preferably, the dummy gate width is 2-10 nm wider than the widths of the other gates (non-dummy gates). The different devices can be formed in a closer proximity to each other since the dummy gates/diffusion breaks allows for the devices to be electrically separated instead of spacing the devices apart from each other. Therefore, the diffusion breaks/dummy gates reduce the space needed for electrically spreading the devices.

As the number of dummy gates/diffusion breaks increases then the space saving benefits caused by the utilization of the dummy gates/diffusion breaks is reduced. For example, when utilizing two dummy gates/diffusion breaks to electrically separate devices, where the dummy gates/diffusion breaks have a width of 10 nm larger than the width of the other gates (non-dummy gates), then the space saving benefits can be more than 40%. However, when utilizing five dummy gates/diffusion breaks to electrically separate devices, where the dummy gates/diffusion breaks have a width of 10 nm larger than the width of the other gates (non-dummy gates), then the space saving benefit is reduced to more than 15%. In another example, when utilizing two dummy gates/diffusion breaks to electrically separate devices, where the dummy gates/diffusion breaks have a width of 2 nm larger than the width of the other gates (non-dummy gates), then the space saving benefits can be more than 45%. However, when utilizing five dummy gates/diffusion breaks to electrically separate devices, where the dummy gates/diffusion breaks have a width of 2 nm larger than the width of the other gates (non-dummy gates), then the space saving benefit is more than 19%. Therefore, the number of dummy gates/diffusion breaks and the width of the gates directly determines the space saving benefits created by using the dummy gates/diffusion breaks. It might be better to phrase this as a number of active gates per diffusion break. In the drawing you have 2 active gates per diffusion break.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. An apparatus comprising:
a substrate;
a first nanosheet device located on the substrate;
a second nanosheet device located on the substrate, wherein the second nanosheet device is adjacent to the first nanosheet device;
at least one first gate located on the first nanosheet device, wherein the at least one first gate has a first width;
at least one second gate located on the second nanosheet device, wherein the at least one second gate has a second width, wherein the first width and the second width are substantially the same; and
a single diffusion break located between the first nanosheet device and the second nanosheet device, wherein the single diffusion break prevents the first nanosheet device from contacting the second nanosheet device, wherein the single diffusion break has a vertical first section and a wider head section, wherein the vertical first section of the single diffusion break has a third width, wherein the third width is larger than the first width and the second width.

2. The apparatus of claim 1, wherein the first nanosheet device is in direct contact with a first side of the single diffusion break and the second nanosheet device is in direct contact with a second side of the single diffusion break.

3. The apparatus of claim 2, wherein the first side of the single diffusion break is opposite of the second side of the single diffusion break.

4. The apparatus of claim 1, wherein the single diffusion break is comprised of a dummy gate.

5. The apparatus of claim 4, wherein the single diffusion break is comprised of:
a first spacer located on a first side of the single diffusion break;
a second spacer located on a second side of the single diffusion break; and
a filler material located between the first spacer and the second spacer, wherein the vertical first section of the single diffusion break is comprised of the filler material located between the first spacer and the second spacer, and wherein the wider head section of the single diffusion break is comprised of the filler material that is located on top of the first spacer and the second spacer.

6. The apparatus of claim 5, wherein the filler material is SiN.

7. The apparatus of claim 1, wherein the third width is 2 to 20 nm larger than the first width and the third width is 2 to 20 nm larger than the second width.

8. The apparatus of claim 1, wherein the third width is 2 to 10 nm larger than the first width and the third width is 2 to 10 nm larger than the second width.

9. An apparatus comprising:
a substrate;
a first nanosheet device located on the substrate;
a second nanosheet device located on the substrate, wherein the second nanosheet device is adjacent to the first nanosheet device;
a third nanosheet device located on the substrate, wherein the third nanosheet device is adjacent to the second nanosheet device;
at least one first gate located on the first nanosheet device, wherein the at least one first gate has a first width;
at least one second gate located on the second nanosheet device, wherein the at least one second gate has a second width, wherein the first width and the second width are substantially the same;
at least one third gate located on the third nanosheet device, wherein the at least one third gate has a third width, wherein the third width and the second width are substantially the same;
a first diffusion break located between the first nanosheet device and the second nanosheet device, wherein the first diffusion break prevents the first nanosheet device from contacting the second nanosheet device, wherein the first diffusion break has a vertical first section and a wider first head section, wherein the vertical first section of the first diffusion break has a fourth width, wherein the fourth width is larger than the first width and the second width; and a second diffusion break located between the second nanosheet device and the third nanosheet device, wherein the second diffusion break prevents the second nanosheet device from contacting the third nanosheet device, wherein the second diffusion break has a vertical second section and a wider second head section, wherein the vertical second section of the second diffusion break has a fifth width, wherein the fifth width is larger than the second width and the third width.

10. The apparatus of claim 9, wherein the first nanosheet device is in direct contact with a first side of the first diffusion break and the second nanosheet device is in direct contact with a second side of the first diffusion break.

11. The apparatus of claim 10, wherein the first side of the first diffusion break and the second side of the first diffusion break are different sides of the first diffusion break.

12. The apparatus of claim 11, wherein the second nanosheet device is in direct contact with a first side of the second diffusion break and the third nanosheet device is in direct contact with a second side of the second diffusion break.

13. The apparatus of claim 12, wherein the first side of the second diffusion break and the second side of the second diffusion break are different sides of the second diffusion break.

14. The apparatus of claim 9, wherein the first diffusion break and the second diffusion break are a dummy gate.

15. The apparatus of claim 14, further comprising:
wherein the first diffusion break is comprised of:
a first spacer located on a first side of the first diffusion break;
a second spacer located on a second side of the first diffusion break; and
a filler material located between the first spacer and the second spacer, and the filler material is located on top of the first spacer and the second spacer;
wherein the second diffusion break is comprised of:
a third spacer located on the first side of the second diffusion break;
a fourth spacer located on the second side of the second diffusion break; and
a second filler material located between the third spacer and the fourth spacer, and the second filler material is located on top of the third spacer and the fourth spacer.

16. The apparatus of claim 15, wherein the filler material is SiN.

17. The apparatus of claim 9, wherein the fourth width and the fifth width are 2 to 20 nm larger than the first width, wherein the fourth width and the fifth width are 2 to 20 nm larger than the second width, wherein the fourth width and the fifth width are 2 to 20 nm larger than the third width.

18. The apparatus of claim 9, wherein the fourth width and the fifth width are 2 to 10 nm larger than the first width, wherein the fourth width and the fifth width are 2 to 10 nm larger than the second width, wherein the fourth width and the fifth width are 2 to 10 nm larger than the third width.

19. A method comprising:
forming a first nanosheet device on a substrate;
forming a second nanosheet device on the substrate, wherein the second nanosheet device is adjacent to the first nanosheet device, wherein the first nanosheet device and the second nanosheet device are formed at the same time;
forming at least one first gate located on the first nanosheet device, wherein the at least one first gate has a first width;
forming at least one second gate located on the second nanosheet device, wherein the at least one second gate has a second width, wherein the first width and the second width are substantially the same; and
forming a diffusion break located between the first nanosheet device and the second nanosheet device, wherein the diffusion break is comprised of a first spacer located on a first side of the diffusion break, a second spacer located on a second side of the diffusion break, and a filler material located between the first spacer and the second spacer, wherein the diffusion break prevents the first nanosheet device from contacting the second nanosheet device, wherein the diffusion break has a third width, wherein the third width is larger than the first width and the second width.

20. The method of claim 19, wherein the third width is 2 to 10 nm larger than the first width and the third width is 2 to 10 nm larger than the second width.

* * * * *